(12) United States Patent
Song

(10) Patent No.: US 11,081,678 B2
(45) Date of Patent: Aug. 3, 2021

(54) DISPLAY PANEL, METHOD FOR FABRICATING THE SAME, AND DISPLAY DEVICE

(71) Applicant: BOE Technology Group Co., Ltd., Beijing (CN)

(72) Inventor: Wenfeng Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/690,565

(22) Filed: Nov. 21, 2019

(65) Prior Publication Data

US 2020/0220111 A1 Jul. 9, 2020

(30) Foreign Application Priority Data

Jan. 3, 2019 (CN) .......................... 201910005368.X

(51) Int. Cl.
*H01L 51/52* (2006.01)
*H01L 51/56* (2006.01)
*H01L 27/32* (2006.01)

(52) U.S. Cl.
CPC ...... *H01L 51/5281* (2013.01); *H01L 27/3211* (2013.01); *H01L 51/56* (2013.01); *G02F 2201/38* (2013.01); *H01L 27/322* (2013.01)

(58) Field of Classification Search
CPC .. H01L 51/5281; H01L 51/56; G02F 2201/38
See application file for complete search history.

(56) References Cited

U.S. PATENT DOCUMENTS

| 8,841,836 B2 | 9/2014 | Kim et al. |
| 10,473,838 B2* | 11/2019 | Zhang ................. G02F 1/113 |
| 10,598,979 B2* | 3/2020 | Wang ............... G02F 1/133526 |
| 2016/0238938 A1* | 8/2016 | Ban ................. H01L 21/31144 |
| 2017/0015584 A1* | 1/2017 | Krzyzak ............... C03C 21/002 |
| 2017/0263657 A1 | 9/2017 | Chu et al. |
| 2018/0106935 A1* | 4/2018 | Zhang ............... G02F 1/133514 |
| 2019/0081220 A1 | 3/2019 | Wang et al. |

(Continued)

FOREIGN PATENT DOCUMENTS

| CN | 101667381 A | 3/2010 |
| CN | 106157818 A | 11/2016 |

(Continued)

OTHER PUBLICATIONS

Office Action for corresponding Chinese Application 201910005368.X dated May 25, 2020.

*Primary Examiner* — Jose R Diaz
(74) *Attorney, Agent, or Firm* — Arent Fox LLP; Michael Fainberg

(57) ABSTRACT

A display panel, a method for fabricating the same, and a display device are disclosed, where the display panel includes: a base substrate, sub-pixel units in at least two colors on the base substrate, and an anti-reflection layer on a side of the sub-pixel units away from the base substrate, wherein the anti-reflection layer includes anti-reflection components arranged in an array, which correspond to the sub-pixel units in a one-to-one manner, and are configured to alleviate reflected light in the same colors as the corresponding sub-pixel units, and sub-pixel units in different colors correspond to different anti-reflection components.

3 Claims, 4 Drawing Sheets

(56) References Cited

U.S. PATENT DOCUMENTS

2019/0317353 A1* 10/2019 Shim .................. G02B 1/14
2019/0346972 A1   11/2019 Wang

FOREIGN PATENT DOCUMENTS

| CN | 206179867 A | 5/2017 | |
|----|-------------|--------|--|
| CN | 107342300 A | 11/2017 | |
| CN | 107579147 A | 1/2018 | |
| WO | WO-2017147991 A1 * | 9/2017 | ....... G02F 1/133502 |

* cited by examiner

DISPLAY PANEL, METHOD FOR FABRICATING THE SAME, AND DISPLAY DEVICE

CROSS-REFERENCE TO RELATED APPLICATION

This disclosure claims priority to Chinese Patent Application No. 201910005368.X, filed on Jan. 3, 2019, the content of which is incorporated by reference in the entirety.

TECHNICAL FIELD

The disclosure relates to the field of display technologies, and particularly to a display panel, a method for fabricating the same, and a display device.

DESCRIPTION OF THE RELATED ART

A base substrate of a display panel in the related art is generally made of glass with such a high reflectivity for light that a light source is reflected in a mirroring manner on the glass surface of the display panel on which intensive ambient light such as lamplight or sunlight is incident, so that a user cannot see what is displayed on the display panel clearly.

SUMMARY

Embodiments of the disclosure provide a display panel, a method for fabricating the same, and a display device.

In an aspect, the embodiments of the disclosure provide a display panel including: a base substrate, sub-pixel units in at least two colors on the base substrate, and an anti-reflection layer a side of the sub-pixel units away from the base substrate, wherein:

the anti-reflection layer includes anti-reflection components arranged in an array, which correspond to the sub-pixel units in a one-to-one manner, and are configured to alleviate reflected light in the same colors as the corresponding sub-pixel units, and sub-pixel units in different colors correspond to different anti-reflection components.

In some embodiments, the anti-reflection components are arranged at the same layer.

In some embodiments, normal projections of the anti-reflection components onto the base substrate cover normal projections of the corresponding sub-pixel units onto the base substrate.

In some embodiments, thicknesses of anti-reflection components corresponding to the sub-pixel units in the different colors are different.

In some embodiments, a thickness h of each of the anti-reflection components satisfies $h=k\lambda/4$, wherein k is a positive odd integer, and $\lambda$ is a wavelength of light rays in a color of a sub-pixel unit corresponding to the each of the anti-reflection components.

In some embodiments, the anti-reflection components are made of a photoresist material.

In some embodiments, the display panel further includes a protecting layer, wherein:

the protecting layer includes protecting components arranged in an array, which correspond to the anti-reflection components in a one-to-one manner, and are arranged on sides of the corresponding anti-reflection components away from the base substrate.

In some embodiments, normal projections of the protecting components onto the base substrate coincide with normal projections of the anti-reflection components onto the base substrate.

In some embodiments, each of the protecting components includes a low-refractive-index layer, wherein a refractive index of the low-refractive-index layer is less than 1.5.

In some embodiments, the low-refractive-index layer includes an inorganic material and/or an organic material with different refractive indexes.

In another aspect, the embodiments of the disclosure further provide a display device including the display panel above according to the embodiments of the disclosure.

In still another aspect, the embodiments of the disclosure further provide a method for fabricating a display panel, the method including:

forming sub-pixel units in at least two colors on a base substrate; and forming an anti-reflection layer on a side of the sub-pixel units away from the base substrate;

wherein the anti-reflection layer includes anti-reflection components arranged in an array, which correspond to the sub-pixel units in a one-to-one manner, and are configured to alleviate reflected light in the same colors as the corresponding sub-pixel units, and sub-pixel units in different colors correspond to different anti-reflection components.

In some embodiments, the forming the anti-reflection layer on the side of the sub-pixel units away from the base substrate includes:

coating a photoresist material on the side of the sub-pixel units away from the base substrate to form a photoresist material layer; and irradiating the photoresist material layer with exposure light rays using a preset mask to form the anti-reflection layer, wherein the exposure light rays include ultraviolet rays.

In some embodiments, the preset mask includes a plurality of zones arranged in an array, wherein the plurality of zones correspond to the sub-pixel units, and transmittivities for ultraviolet rays corresponding to respective zones are different, so that the photoresist material layer is irradiated with the exposure light rays in the respective zones to form anti-reflection components corresponding to the sub-pixel units.

In some embodiments, the irradiating the photo-resist material layer with the exposure light rays using the preset mask to form the anti-reflection layer includes:

irradiating the photoresist material layer with the exposure light rays through the plurality of zones of the preset mask, and processing the photoresist material layer in a development process to form the anti-reflection layer.

In some embodiments, the forming an anti-reflection layer on the side of the sub-pixel units away from the base substrate includes:

forming an anti-reflection layer on the side of the sub-pixel units away from the base substrate in an inkjet printing or nanometer transfer-printing process.

Other features and advantages of the disclosure will be set forth in the following description, and will partly become apparent from the description, or can be known from the practice of the disclosure. The objects and other advantages of the disclosure will be attained and achieved using the structures in some embodiments pointed out in the description, the claims, and the drawings.

BRIEF DESCRIPTION OF THE DRAWINGS

The drawings are intended to provide further understanding of the technical solutions according to the embodiments of the disclosure, constitute a part of the specification, and serve together with the embodiments of the disclosure to explain the technical solutions according to the disclosure, but shall not limit the technical solutions of the disclosure thereto.

DETAILED DESCRIPTION OF THE EMBODIMENTS

In order to make the objects, technical solutions, and advantages of the embodiments of the disclosure more apparent, the technical solutions according to the embodiments of the disclosure will be described below in details with reference to the drawings. It shall be noted that the embodiments of the disclosure, and the features in the embodiments of the disclosure can be combined with each other unless they conflict with each other.

The steps illustrated in the flow chart of the drawings can be performed in a computer system of a set of computer executable instructions, for example. Although a logic order is illustrated in the flow chart, the illustrated or described steps can be performed in another order than the order illustrated here in some instance.

Unless defined otherwise, technical terms or scientific terms throughout the disclosure shall convey their usual meaning as appreciated by those ordinarily skilled in the art to which the disclosure pertains. The terms "first", "second", or the like throughout the disclosure do not suggest any order, number or significance, but is only intended to distinguish different components from each other. Alike, the terms "include", "comprise", or the like refer to that an element or an item preceding to the term encompasses an element(s) or an item(s) succeeding to the term, and its (or their) equivalence(s), but shall not preclude another element(s) or item(s). The term "connect", "connected", or the like does not suggest physical or mechanical connection, but may include electrical connection no matter whether it is direct or indirect. The terms "above", "below", "left", "right", etc., are only intended to represent a relative positional relationship, and when the absolute position of an object as described is changed, the relative positional relationship may also be changed accordingly.

The inventors have identified from their study that the display panel in the related art is designed with an anti-reflection layer for green light to which human eyes are sensitive so that the display panel can have a better effect of alleviating green light in the ambient from being reflected than light rays in the other colors. And since the display panel is less effective of alleviating light rays in the other colors in the ambient from being reflected, the reflectivity of the display panel is relatively high.

Figure 1:
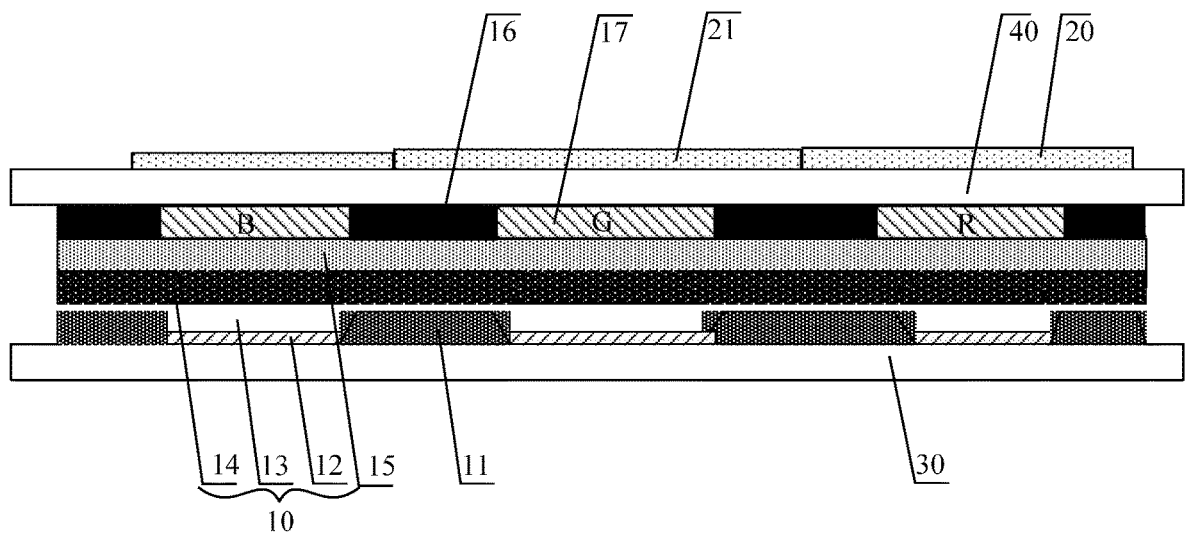
FIG. 1 illustrates a schematic structural diagram of a display panel according to the embodiments of the disclosure.

In view of the above, the embodiments of the disclosure provide a display panel so as to improve the effect of alleviating light rays in at least two colors in the ambient from being reflected, thus lowering the reflectivity of the display panel, where FIG. 1 illustrates a schematic structural diagram of the display panel according to the embodiments of the disclosure. As illustrated in FIG. 1, the display panel according to the embodiments of the disclosure includes: a base substrate 30, sub-pixel units 10 in at least two colors on the base substrate 30, and an anti-reflection layer 20 on a side of the sub-pixel units 10 away from the base substrate 30 (i.e. on a light exit side of the display panel), where the anti-reflection layer 20 includes anti-reflection components 21 arranged in an array, which correspond to the sub-pixel units in a one-to-one manner, and are configured to alleviate reflected light in the same colors as the corresponding sub-pixel units, and the sub-pixel units 10 in different colors correspond to different anti-reflection components 21.

In some embodiments, as illustrated in FIG. 1, the display panel further includes a protecting substrate 40 opposite to the base substrate 30, where the sub-pixel units 10 are arranged between the base substrate 30 and the protecting substrate 40, and the anti-reflection layer 20 is arranged on a side of the protecting substrate 40 away from the base substrate 30.

In some embodiments, the base substrate 30 and the protecting substrate 40 can be rigid substrates or flexible substrates, where the material of the rigid substrates can include but will not be limited to one or more of glass and a metal foil, and the material of the flexible substrates can include but will not be limited to one or more of polyethylene terephthalate, terephthalate, polyether ether ketone, polystyrene, polycarbonate, polyarylate, polyaryl ester, polyimide, polyvinyl chloride, polyethylene, or textile fiber.

In some embodiments, the base substrate 30 is an array substrate, the protecting substrate 40 is a color filter substrate, and the anti-reflection layer 20 is arranged on a surface of the protecting substrate 40 to thereby lower the reflectivity of the surface of the display panel.

In some embodiments, the colors of the sub-pixel units are determined according to the type of the display panel, which will not be limited in the embodiments of the disclosure.

In some embodiments, the display panel in the embodiments of the disclosure can be a liquid crystal display panel, or can be an Organic Light-Emitting Diode (OLED) display panel. It shall be noted that FIG. 1 illustrates an OLED display panel as an example, and as illustrated in FIG. 1, each sub-pixel unit 10 can include OLED element layers including an anode 12, an organic light-emitting layer 13, and a cathode 14, and a pixel definition layer 11 and a planarization layer 15 can be further arranged on the base substrate 30. It shall be noted that, the display panel can further include a black matrix layer 16 and a color filter layer 17, and in some embodiments, the color filter layer 17 can be arranged on a side of the protecting substrate 40 proximate to the base substrate 30. Further, the display panel can alternatively include no color filter layer. Here, FIG. 1 illustrates the display panel including the color filter layer as an example, but the embodiments of the disclosure will not be limited thereto.

In some embodiments, FIG. 1 illustrates sub-pixel units in three colors as an example, and in this case, the color filter layer 17 includes a red filter R, a blue filter B, and a green filter G, where each filter corresponds to one of the sub-pixel units. In the embodiments of the disclosure, each sub-pixel unit is configured with one anti-reflection component to alleviate reflected light of light rays in the same color as the sub-pixel unit.

In some embodiments, the pixel definition layer 11 is configured to define the sub-pixel units, and made of a material including silicon nitride, silicon oxide, polyimide, teflon, or photoresist such as polyvinyl alcohol, laurate, etc.

In some embodiments, the anode 12 is made of a material including tin indium oxide, aluminum, or silver.

In some embodiments, the cathode 14 is made of a material including tin indium oxide or tin zinc oxide.

In some embodiments, the planarization layer 15 is made of a material including polymethyl methacrylate, polyimide or organic silicon.

In some embodiments, the black matrix layer 16 is made of a material including black photoresist.

The display panel according to the embodiments of the disclosure includes: a base substrate, sub-pixel units in at least two colors on the base substrate, and an anti-reflection layer on a side of the sub-pixel units away from the base substrate (i.e. on a light exit side of the display panel), where the anti-reflection layer includes anti-reflection components arranged in an array, which correspond to the sub-pixel units in a one-to-one manner, and are configured to alleviate reflected light in the same colors as the corresponding sub-pixel units, and the sub-pixel units in different colors correspond to different anti-reflection components. In the embodiments of the disclosure, the anti-reflection layer including a plurality of anti-reflection components is arranged to thereby improve the effect of alleviating light rays in the at least two colors in the ambient from being reflected, so as to lower the reflectivity of the display panel.

In some embodiments, as illustrated in FIG. 1, the anti-reflection components 21 are arranged at the same layer, and it shall be noted that the anti-reflection components 21 arranged at the same layer means that the anti-reflection components 21 are located on the same side of the protecting substrate 40, or all of the surfaces of the anti-reflection components 21 proximate to the base substrate 30 come into contact with the surface of the protecting substrate 40.

In some embodiments, as illustrated in FIG. 1, normal projections of the anti-reflection components 21 onto the base substrate 30 cover normal projections of the corresponding sub-pixel units onto the base substrate 30.

In some embodiments, the anti-reflection components 21 are made of a photoresist material, e.g., magnesium fluoride ($MgF_2$), photoresist, etc., although the embodiments of the disclosure will not be limited thereto.

In some embodiments, the anti-reflection components 21 are made of a transparent material, and are non-crystalline or amorphous layers to thereby prevent light from being scattered.

In some embodiments, as illustrated in FIG. 1, there are different thicknesses of the anti-reflection components corresponding to the sub-pixel units in the different colors.

In some embodiments, the thickness h of each anti-reflection component satisfies $h=k\lambda/4$, where k is a positive odd integer, and $\lambda$ is a wavelength of light rays in a color of the sub-pixel unit corresponding to the anti-reflection component.

For example, if the color of the sub-pixel unit corresponding to the anti-reflection component is blue, then the thickness of the anti-reflection component will be $h=k\lambda_1/4$, where $\lambda_1$ is the wavelength of blue light; if the color of the sub-pixel unit corresponding to the anti-reflection component is green, then the thickness of the anti-reflection component will be $h=k\lambda_2/4$, where $\lambda_2$ is the wavelength of green light; and if the color of the sub-pixel unit corresponding to the anti-reflection component is red, then the thickness of the anti-reflection component will be $h=k\lambda_3/4$, where $\lambda_3$ is the wavelength of red light. Further, since the wavelength of red light is longer than the wavelength of green light, and the wavelength of green light is longer than the wavelength of blue light, the thickness of the anti-reflection component corresponding to the red sub-pixel unit is larger than the thickness of the anti-reflection component corresponding to the green sub-pixel unit, and the thickness of the anti-reflection component corresponding to the green sub-pixel unit is larger than the thickness of the anti-reflection component corresponding to the blue sub-pixel unit.

Figure 2A:
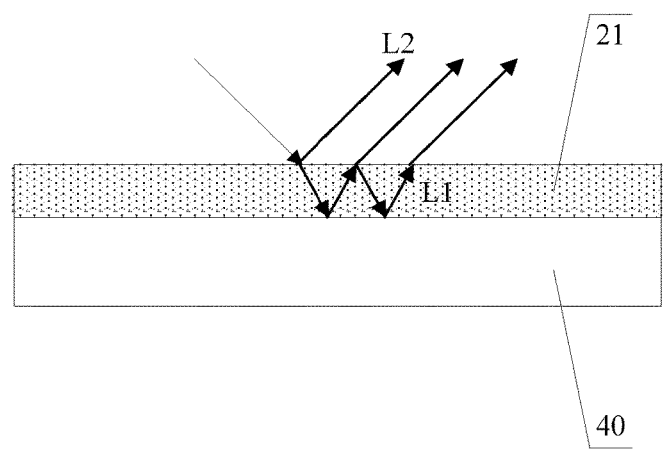
FIG. 2A illustrates an operating principle diagram of alleviating light from being reflected.
Figure 2B:
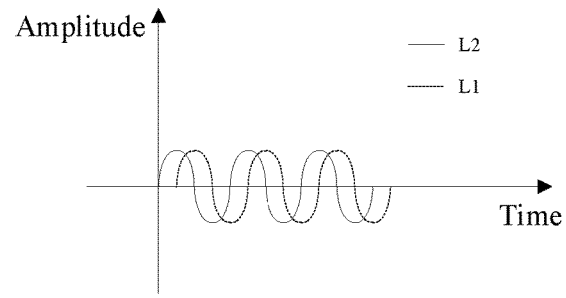
FIG. 2B illustrates a waveform diagram of reflected light.

An operating principle of alleviating reflection will be further described below. FIG. 2A illustrates an operating principle of alleviating reflection, and FIG. 2B illustrates a waveform of reflected light. As illustrated in FIG. 2A, the side of an anti-reflection component 21 away from the protecting substrate 40 is a first interface, and the side of the anti-reflection component 21 proximate to the protecting substrate 40 is a second interface. In the embodiments of the disclosure, the thickness h of the anti-reflection component satisfies $h=k\lambda/4$ so that the phase of reflected light L1 returned from the second interface to the first interface is different from the phase of reflected light L2 at the first interface (i.e. the part of the ambient light incident to the first interface that is reflected at the first interface) by an integer multiple of 180 degrees. As illustrated in FIG. 2B, the reflected light L1 returned from the second interface to the first interface cancels out the reflected light L2 at the first interface to some extent to thereby eliminate interference of the reflected light so as to alleviate the reflected light.

Figure 3:
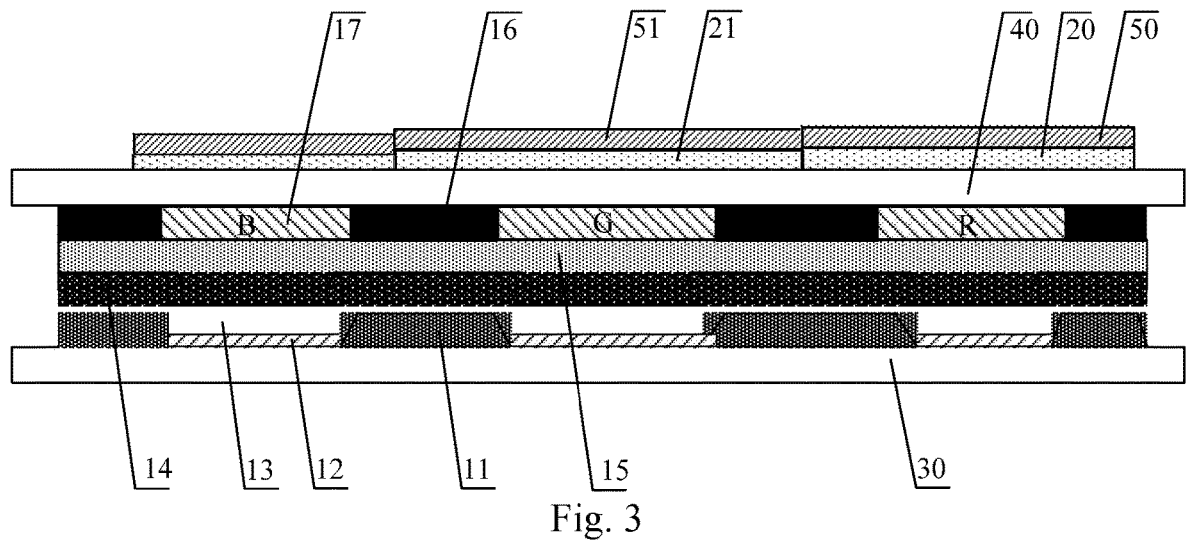
FIG. 3 illustrates another schematic structural diagram of a display panel according to the embodiments of the disclosure.

In some embodiments, in order to protect the anti-reflection layer, as illustrated in FIG. 3 which is another schematic structural diagram of the display panel according to the embodiments of the disclosure, the display panel according to the embodiments of the disclosure further includes a protecting layer 50.

In some embodiments, the protecting layer 50 includes protecting components 51 arranged in an array, which correspond to the anti-reflection components 21 in a one-to-one manner, and are arranged on sides of the corresponding anti-reflection components 21 away from the protecting substrate 40.

In some embodiments, normal projections of the protecting components 51 onto the base substrate 30 coincide with the normal projections of the anti-reflection components 21 onto the base substrate 30.

In some embodiments, in order to lower the difference in refractive index between the air, and the surface of the display panel, each protecting component 51 includes a low-refractive-index layer, where the refractive index of the low-refractive-index layer is less than 1.5.

In some embodiments, the low-refractive-index layer includes an inorganic material and/or an organic material with different refractive indexes, although the embodiments of the disclosure will not be limited thereto.

Figure 4:
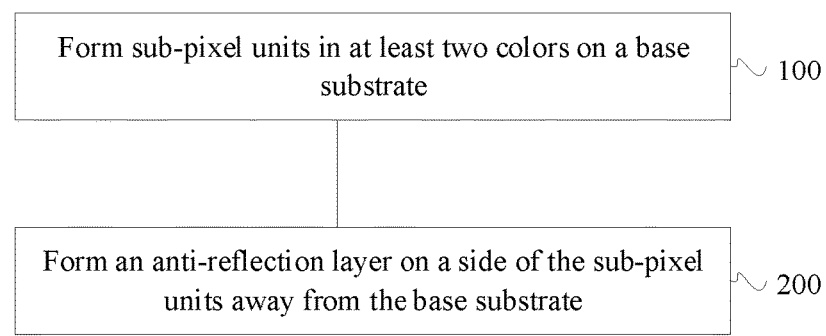
FIG. 4 illustrates a flow chart of a method for fabricating a display panel according to the embodiments of the disclosure.

Based upon the same inventive concept, the embodiments of the disclosure further provide a method for fabricating a display panel, and FIG. 4 illustrates a flow chart of the method for fabricating a display panel according to the embodiments of the disclosure. As illustrated in FIG. 4, the method for fabricating a display panel according to the embodiments of the disclosure includes the following steps.

The step 100 is to form sub-pixel units in at least two colors on a base substrate.

In some embodiments, the step 100 includes: providing the base substrate, forming the sub-pixel units in the at least two colors on the base substrate, and arranging a protecting substrate on the sub-pixel units.

In some embodiments, the display panel in the embodiments of the disclosure can be a liquid crystal display panel, or can be an Organic Light-Emitting Diode (OLED) display panel.

For example, the display panel is an OLED display panel, and in some embodiments, forming the sub-pixel units in the at least two colors on the base substrate includes: forming anodes on the base substrate in a sputtering process, forming a pixel definition layer on the anodes in a patterning process, forming organic light-emitting layers on the pixel definition layer in a vapor-depositing process, and forming cathodes on the organic light-emitting layers in a sputtering process.

Here the "patterning process" as referred to in the embodiments of the disclosure includes coating photoresist, exposing the photoresist using a mask, developing the photoresist, etching the photoresist, and stripping the photoresist, and is a process matured in the related art. The photoresist can be coated and etched in a known coating process and a known etching process in the related art, respectively, although the embodiments of the disclosure will not be limited thereto.

In some embodiments, the pixel definition layer is made of a material including silicon nitride, silicon oxide, polyimide, teflon, or photoresist such as polyvinyl alcohol, laurate, etc.

In some embodiments, the anodes are made of a material including tin indium oxide, aluminum, or silver.

In some embodiments, the cathodes are made of a material including tin indium oxide or tin zinc oxide.

In some embodiments, the method for fabricating a display panel according to embodiments of the disclosure further includes: forming a planarization layer on the cathodes in a patterning process. In some embodiments, the planarization layer is made of a material including polymethyl methacrylate, polyimide, or organic silicon.

In some embodiments, the method for fabricating a display panel according to embodiments of the disclosure further includes: forming a black matrix layer and a color filter layer on the planarization layer in that order in a patterning process.

In some embodiments, the black matrix layer is made of black photoresist.

In some embodiments, the color filter layer includes a red filter, a blue filter, and a green filter, where each filter corresponds to one of the sub-pixel units.

In some embodiments, arranging the protecting substrate on the sub-pixel units includes: arranging the protecting substrate on the black matrix layer and the color filter layer.

In some embodiments, the base substrate can be a rigid substrate or a flexible substrate, where the material of the rigid substrate can include but will not be limited to one or more of glass and a metal foil, and the material of the flexible substrate can include but will not be limited to one or more of polyethylene terephthalate, terephthalate, polyether ether ketone, polystyrene, polycarbonate, polyarylate, polyaryl ester, polyimide, polyvinyl chloride, polyethylene, or textile fiber.

In some embodiments, the protecting substrate can be a rigid substrate or a flexible substrate, where the material of the rigid substrate can include but will not be limited to one or more of glass and a metal foil, and the material of the flexible substrate can include but will not be limited to one or more of polyethylene terephthalate, terephthalate, polyether ether ketone, polystyrene, polycarbonate, polyarylate, polyaryl ester, polyimide, polyvinyl chloride, polyethylene, or textile fiber.

The step 200 is to form an anti-reflection layer on a side of the sub-pixel units away from the base substrate (i.e. on a light exit side of the display panel).

In some embodiments, the anti-reflection layer includes anti-reflection components arranged in an array, which correspond to the sub-pixel units in a one-to-one manner, and are configured to alleviate reflected light in the same colors as the corresponding sub-pixel units, and the sub-pixel units in the different colors correspond to different anti-reflection components.

In some embodiments, the base substrate is an array substrate, the protecting substrate is a color filter substrate, and the anti-reflection layer is arranged on the surface of the protecting substrate to thereby lower the reflectivity of the surface of the display panel.

The method for fabricating a display panel according to the embodiments of the disclosure includes: forming sub-pixel units in at least two colors on a base substrate, and forming an anti-reflection layer on a side of the sub-pixel units away from the base substrate (i.e. on a light exit side of the display panel), where the anti-reflection layer includes anti-reflection components arranged in an array, which correspond to the sub-pixel units in a one-to-one manner, and are configured to alleviate reflected light in the same colors as the corresponding sub-pixel units, and the sub-pixel units in the different colors correspond to different anti-reflection components. In the embodiments of the disclosure, the anti-reflection layer including a plurality of anti-reflection components is arranged on the side of the sub-pixel units away from the base substrate (i.e. on the light exit side of the display panel) to thereby improve the effect of alleviating light rays in the at least two colors from being reflected, so as to lower the reflectivity of the display panel.

In some embodiments, the step 200 includes: coating a photoresist material on the side of the sub-pixel units away from the base substrate (i.e. on the light exit side of the display panel) to form a photoresist material layer; and irradiating the photoresist material layer with exposure light rays using a preset mask to form the anti-reflection layer.

In some embodiments, irradiating the photoresist material layer with the exposure light rays using the preset mask to form the anti-reflection layer includes: irradiating the photoresist material layer with the exposure light rays through a plurality of zones of the preset mask, and processing the photoresist material layer in a development process to form the anti-reflection layer.

In some embodiments, the exposure light rays include ultraviolet (UV) rays.

Figure 5:
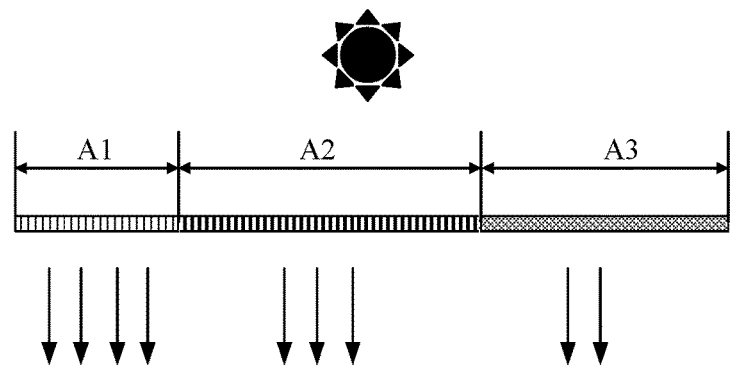
FIG. 5 illustrates a schematic structural diagram of a preset mask according to the embodiments of the disclosure.

In some embodiments, FIG. 5 illustrates a schematic structural diagram of a preset mask according to embodiments of the disclosure, and as illustrated in FIG. 5, the preset mask includes a plurality of zones arranged in an array, where each zone corresponds to one of the sub-pixel units, and there are different transmittivities for UV rays corresponding to the respective zones, so that the photoresist material layer is illuminated with the exposure light rays in the respective zones to form the anti-reflection components corresponding to the sub-pixel units.

In some embodiments, the number of types of zones in the preset mask is the same as the number of colors of the sub-pixel units in the display panel, and FIG. 5 illustrates the sub-pixel units in three colors in the display panel as an example, so the preset mask includes a first zone A1, a second zone A2, and a third zone A3.

In some embodiments, as illustrated in FIG. 5, an anti-reflection component for alleviating blue reflected light with the thickness of $h=k\lambda_1/4$ is formed in a first zone A1, an anti-reflection component for alleviating green reflected light with the thickness of $h=j\lambda_2/4$ is formed in a second zone A2, and an anti-reflection component for alleviating red reflected light with the thickness of $h=k\lambda_3/4$ is formed in a third zone A3, where $\lambda_1<\lambda_2<\lambda_3$. When the anti-reflection components are made of positive photoresist, the transmittivity for UV rays corresponding to the first area A1 is higher than the transmittivity for UV rays corresponding to the second area A2, and the transmittivity for UV rays corresponding to the second area A2 is higher than the transmittivity for UV rays corresponding to the third area A3, so that the thickness of the anti-reflection component corresponding to a formed blue sub-pixel unit is less than the thickness of the anti-reflection component corresponding to a formed green sub-pixel unit, and the thickness of the anti-reflection component corresponding to the formed green sub-pixel unit is less than the thickness of the anti-reflection component corresponding to a formed red sub-pixel unit. That is, when the anti-reflection components are made of positive photoresist, the transmittivity for UV rays in a corresponding zone of the preset mask is decrementing as the wavelength of reflected light to be alleviated is incrementing. When the anti-reflection components are made of negative photoresist, the transmittivity for UV rays corresponding to the first area A1 is lower than the transmittivity for UV rays corresponding to the second area A2, and the transmittivity for UV rays corresponding to the second area A2 is lower than the transmittivity for UV rays corresponding to the third area A3, so that the thickness of the anti-reflection component corresponding to a formed blue sub-pixel unit is less than the thickness of the anti-reflection component corresponding to a formed green sub-pixel unit, and the thickness of the anti-reflection component corresponding to the formed green sub-pixel unit is less than the thickness of the anti-reflection component corresponding to a formed red sub-pixel unit. That is, when the anti-reflection components are made of negative photoresist, the transmittivity for UV rays in a corresponding zone of the preset mask is incrementing as the wavelength of reflected light to be alleviated is incrementing. In some embodiments, the structure of the preset mask is determined according to the material of the anti-reflection components, and will not be limited in the embodiments of the disclosure. Further, it shall be noted that FIG. 5 illustrates the structure of the preset mask when the anti-reflection components are made of positive photoresist as an example.

In some embodiments, as another implementation, the step 200 includes: forming the anti-reflection layer on the side of the sub-pixel units away from the base substrate (i.e. on the light exit side of the display panel) in an inkjet printing or nanometer transfer-printing process.

In some embodiments, after the step 200, the method for fabricating a display panel according to the embodiments of the disclosure further includes: forming a protecting layer on a side of the anti-reflection layer away from the base substrate.

In some embodiments, forming the protecting layer on the side of the anti-reflection layer away from the protecting substrate includes: coating a protecting material on the side of the anti-reflection layer away from the protecting substrate, and forming the protecting layer in a patterning process.

Here the protecting layer includes protecting components arranged in an array, which correspond to the anti-reflection components in a one-to-one manner, and are arranged on the sides of the corresponding anti-reflection components away from the protecting substrate.

In the embodiments of the disclosure, the photoresist material layer is illuminated using the preset mask so that the anti-reflection components with the different thicknesses can be formed due to the different transmittivities for UV rays in the different zones of the preset mask.

The method for fabricating a display panel according to the embodiments of the disclosure according to the embodiments of the disclosure will be described below in further details with reference to FIG. 6A to FIG. 6C.

Figure 6A:
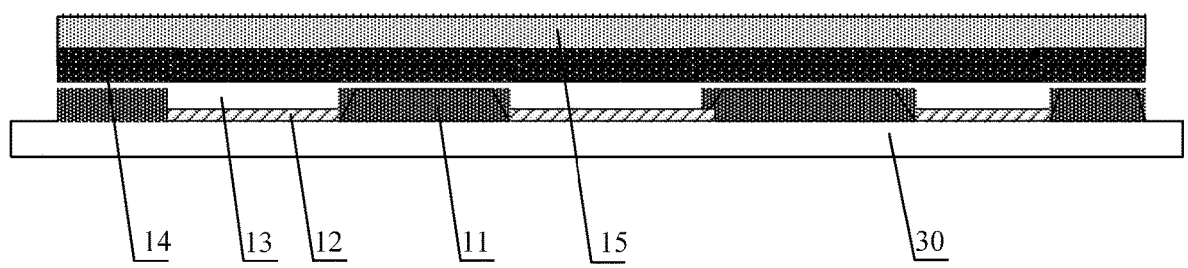
FIG. 6A illustrates a first schematic structural diagram of a display panel in a process for fabricating the display panel according to the embodiments of the disclosure.

The step S1 is to provide a base substrate 30, and to form anodes 12, a pixel definition layer 11, organic light-emitting layers 13, cathodes 14, and a planarization layer 15 on the base substrate 30 in that order, as illustrated in FIG. 6A.

In some embodiments, a conductive thin film is formed on the base substrate 30 in a sputtering process 30, and the anodes 12 are formed in a patterning process based on the conductive thin film; a pixel definition material is formed on the base substrate 30 in a coating process, and the pixel definition layer 11 is formed in a patterning process based on the pixel definition material; the organic light-emitting layers 13 are formed on the anodes in a vapor-depositing process; a conductive thin film is formed on the organic light-emitting layers 13 in a sputtering process, and the cathodes 14 are formed in a patterning process based on the conductive thin film; and a planarization material is formed on the cathodes 14 in a coating process, and the planarization layer 15 is formed in a patterning process based on the planarization material.

Figure 6B:
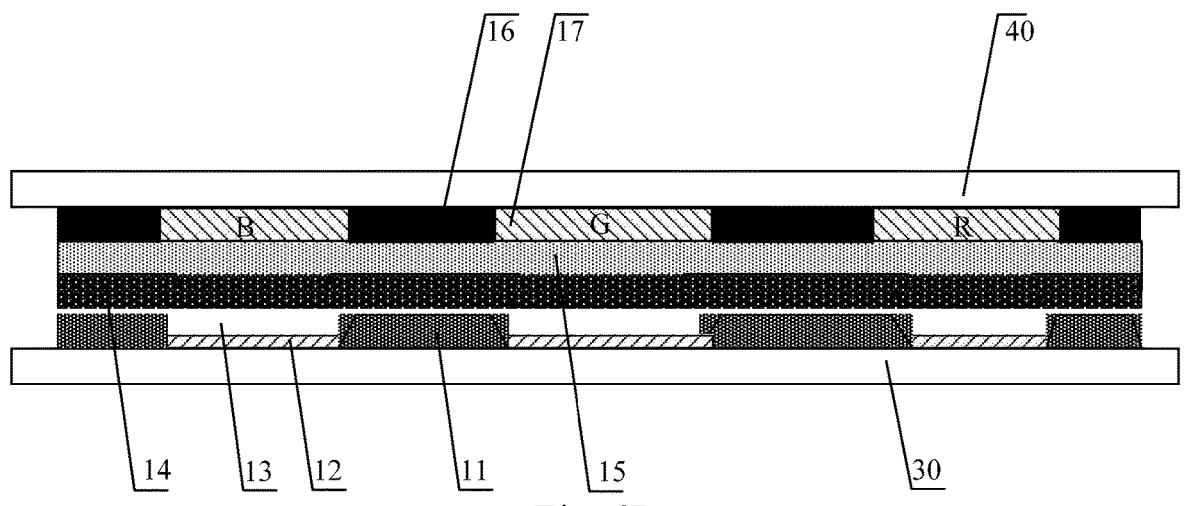
FIG. 6B illustrates a second schematic structural diagram of the display panel in the process for fabricating the display panel according to the embodiments of the disclosure.

The step S2 is to form a black matrix layer 16 and a color filter layer 17 on the planarization layer 15, and to arrange a protecting substrate 40 on the black matrix layer 16 and the color filter layer 17, as illustrated in FIG. 6B.

In some embodiments, the black matrix layer 16 and the color filter layer 17 are formed on the planarization layer 15 in a patterning process.

Figure 6C:
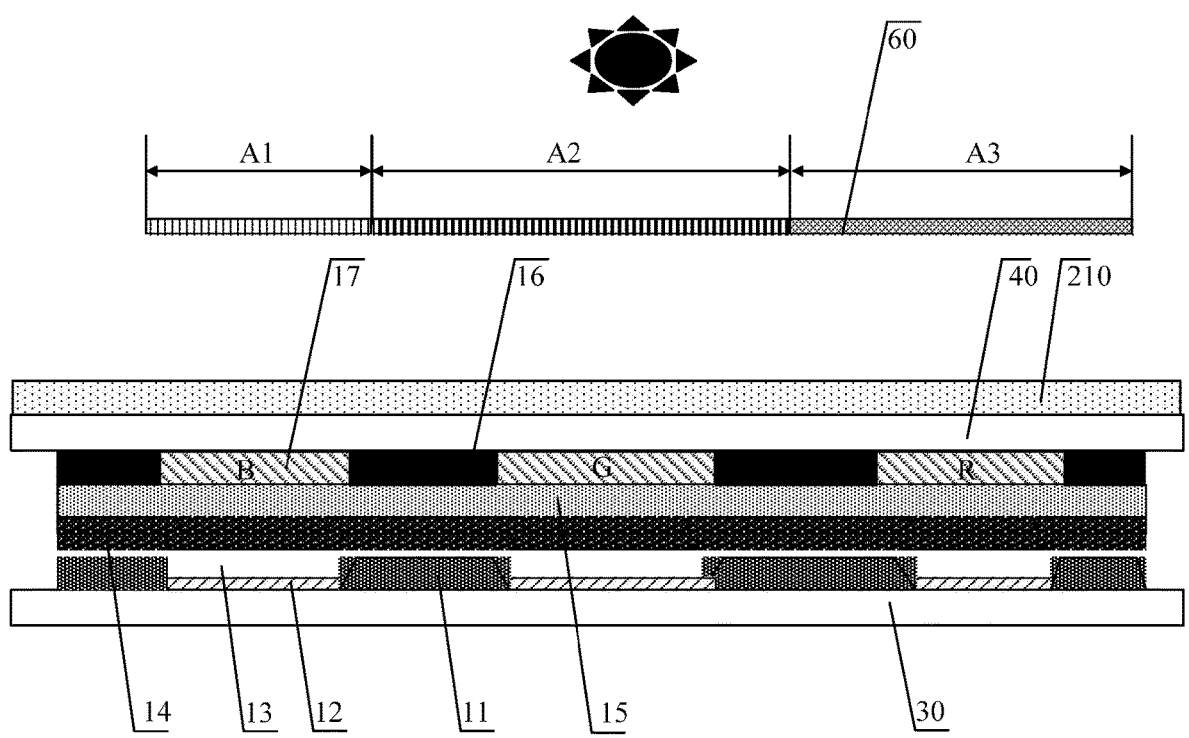
FIG. 6C illustrates a third schematic structural diagram of the display panel in the process for fabricating the display panel according to the embodiments of the disclosure.

The step S3 is to coat a photoresist material layer 210 on the protecting substrate 40, and to illuminate the photoresist material layer 210 with exposure light rays using a preset mask 60, as illustrated in FIG. 6C.

The step S4 is to process the photoresist material layer 210 in a development process to form an anti-reflection layer as illustrated in FIG. 1.

The step S5 is to coat a protecting material on the anti-reflection layer 20, and to form a protecting layer 50 in a patterning process, as illustrated in FIG. 3.

It shall be noted that, the anti-reflection layer in the embodiments of the disclosure is formed by coating the photoresist material, illuminating the photoresist material with UV rays, and forming the anti-reflection layer in a development process, or the anti-reflection layer in the embodiments of the disclosure can alternatively be formed in an inkjet printing or nanometer transfer-printing process as in the related art, so a repeated description thereof will be omitted here.

Based upon the same inventive concept, the embodiments of the disclosure further provide a display device including a display panel.

Here the display panel is the display panel according to the embodiments of the disclosure, and has a similar implementation principle and effect thereto, so a repeated description thereof will be omitted here.

In some embodiments, the display device can be a mobile phone, a tablet computer, a TV set, a monitor, a notebook computer, a digital photo frame, a navigator, or any product or component with a display function, although the embodiments of the disclosure will not be limited thereto.

The drawings in the embodiments of the disclosure only illustrate the structures to which the embodiments of the disclosure relate, but other necessary structures as known in the related art have been omitted for the sake of conciseness.

For the sake of clarity, the thicknesses and sizes of layers or micro structures in the drawings to which reference is made in the description of the embodiments of the disclosure are exaggerated. It can be appreciated that when a structure, e.g., a layer, a film, an area, a substrate, etc., is referred to as "on", "above", or "below" another structure, the structure may be "directly" "on", "above" or "below" the other structure, or there may be an intermediate structure between them.

The embodiments of the disclosure, and the features in the embodiments of the disclosure can be combined with each other unless they conflict with each other.

Although the embodiments of the disclosure are disclosed as above, the disclosure is only intended to illustrate the embodiments to thereby facilitate understanding of the disclosure, but not intended to limit the disclosure thereto. Those skilled in the art can make any modifications and variations thereto in form and detail without departing the spirit of the disclosure of the disclosure, but the claimed scope of the disclosure shall be as defined in the appended claims of the disclosure.

The invention claimed is:

1. A method for fabricating a display panel, comprising:
   forming sub-pixel units in at least two colors on a base substrate; and
   forming an anti-reflection layer on a side of the sub-pixel units away from the base substrate;
   wherein the anti-reflection layer comprises anti-reflection components arranged in an array, which correspond to the sub-pixel units in a one-to-one manner, and are configured to alleviate reflected light in same colors as the corresponding sub-pixel units, and sub-pixel units in different colors correspond to different anti-reflection components;
   wherein the forming the anti-reflection layer on the side of the sub-pixel units away from the base substrate comprises:
   coating a photoresist material on the side of the sub-pixel units away from the base substrate to form a photoresist material layer; and
   irradiating the photoresist material layer with exposure light rays using a preset mask to form the anti-reflection layer, wherein the exposure light rays comprise ultraviolet rays;
   wherein the preset mask comprises a plurality of zones arranged in an array;
   wherein the plurality of zones correspond to the sub-pixel units, and transmittivities for ultraviolet rays corresponding to respective zones are different, so that the photoresist material layer is irradiated with the exposure light rays in the respective zones to form anti-reflection components corresponding to the sub-pixel units.

2. The method according to claim 1, wherein the irradiating the photoresist material layer with the exposure light rays using the preset mask to form the anti-reflection layer comprises:
   irradiating the photoresist material layer with the exposure light rays through the plurality of zones of the preset mask, and processing the photoresist material layer in a development process to form the anti-reflection layer.

3. The method according to claim 1, wherein the forming the anti-reflection layer on the side of the sub-pixel units away from the base substrate comprises:
   forming the anti-reflection layer on the side of the sub-pixel units away from the base substrate in an inkjet printing or nanometer transfer-printing process.

* * * * *